US008779926B2

(12) United States Patent
Schechter

(10) Patent No.: US 8,779,926 B2
(45) Date of Patent: Jul. 15, 2014

(54) PRESENTING INFORMATION REGARDING CONDITIONS OF AN ENVIRONMENT WITH A VISUAL REPRESENTATION OF THE ENVIRONMENT

(75) Inventor: Harry J. Schechter, Needham, MA (US)

(73) Assignee: Schechter Tech, LLC, Boston, MA (US)

( * ) Notice: Subject to any disclaimer, the term of this patent is extended or adjusted under 35 U.S.C. 154(b) by 195 days.

(21) Appl. No.: 13/340,051

(22) Filed: Dec. 29, 2011

(65) Prior Publication Data
US 2013/0169443 A1    Jul. 4, 2013

(51) Int. Cl.
G08B 17/00    (2006.01)

(52) U.S. Cl.
USPC ............... 340/584; 340/539.13; 340/825.49

(58) Field of Classification Search
USPC ............ 340/584, 539.13, 539.16, 539.17, 340/870.17, 585, 501, 506, 531, 581, 340/825.49, 825.69, 825.72
See application file for complete search history.

(56) References Cited

U.S. PATENT DOCUMENTS

| | | | |
|---|---|---|---|
| 5,892,441 A | 4/1999 | Woolley et al. | |
| 6,112,246 A | 8/2000 | Horbal et al. | |
| 6,509,830 B1 | 1/2003 | Elliott | |
| 6,553,336 B1 | 4/2003 | Johnson et al. | |
| 6,646,564 B1 | 11/2003 | Azieres et al. | |
| 6,741,174 B2 * | 5/2004 | Rhoades et al. | 340/540 |
| 6,817,757 B1 | 11/2004 | Wallace | |
| 7,026,929 B1 * | 4/2006 | Wallace | 340/539.13 |
| 7,191,097 B1 | 3/2007 | Lee et al. | |
| 7,342,504 B2 | 3/2008 | Crane et al. | |
| 7,456,736 B2 | 11/2008 | Primm et al. | |
| 7,483,805 B2 | 1/2009 | Sparks et al. | |
| 7,688,952 B2 | 3/2010 | Light et al. | |
| 7,822,387 B2 | 10/2010 | Gross | |
| 7,902,975 B2 | 3/2011 | Glenn et al. | |
| 7,952,485 B2 * | 5/2011 | Schechter et al. | 340/584 |
| 8,181,113 B2 | 5/2012 | Abbott et al. | |
| 8,228,183 B2 | 7/2012 | Glenn et al. | |
| 2002/0161624 A1 * | 10/2002 | Bradlee | 705/10 |
| 2006/0028335 A1 | 2/2006 | Glenn et al. | |

(Continued)

OTHER PUBLICATIONS

Cryolog, Traceo product literature, http://www.cryolog.com/en/pages/products_and_services/traceo/index.php, p. 1, 2007, downloaded Oct. 23, 2008.

(Continued)

*Primary Examiner* — Daniel Previl
(74) *Attorney, Agent, or Firm* — Wolf, Greenfield & Sacks, P.C.

(57) ABSTRACT

Configuring a user interface by which a user can view information regarding one or more conditions of an environment collected by an environmental monitoring system. An environmental monitoring system comprises one or more sensor units disposed in an environment and one or more servers. The servers may receive from an operator of the environment a visual representation of the environment and may identify a position in the visual representation corresponding to the location and configure a user interface to present information regarding the environment based at least in part on the positions. The user interface can be configured to display the visual representation and display information related to the first sensor unit so as to indicate a relationship between the information and the position corresponding to the location of the first sensor unit. Information identifying a location of one or more sensor units may be determined through an automated process.

39 Claims, 12 Drawing Sheets

(56) References Cited

U.S. PATENT DOCUMENTS

| | | |
|---|---|---|
| 2006/0218057 A1* | 9/2006 | Fitzpatrick et al. ............. 705/28 |
| 2006/0271695 A1 | 11/2006 | Lavian |
| 2007/0273557 A1* | 11/2007 | Baillot ......................... 340/988 |
| 2008/0052044 A1 | 2/2008 | Shoenfeld |
| 2008/0176539 A1 | 7/2008 | Staton et al. |
| 2008/0186166 A1 | 8/2008 | Zhou et al. |
| 2009/0282715 A1* | 11/2009 | Pemberton ...................... 40/564 |
| 2010/0312881 A1 | 12/2010 | Davis et al. |

OTHER PUBLICATIONS

EasyLog USB Data Logger product literature, http://www.lascarelectronics.com/temperaturedatalogger.php?datalogger=102, p. 1, downloaded Oct. 23, 2008.

iButtonLink Temperature Monitor product literature, http://www.ibuttonlink.com/1-wire-interface-masters.aspx, pp. 1-2, downloaded Oct. 23, 2008.

IT Watchdogs WeatherDuck product literature, http://www.itwatchdogs.com/duckdetails.shtml, p. 1, 2002-2005, downloaded Oct. 23, 2008.

Savvides et al., "The Bits and Flops of the N-hop Multilateration Primitive for Node Localization Problems," WSNA'02, Sep. 28, 2002, Atlanta, Georgia.

Sugano et al., "Indoor Localization System Using RSSI Measurement of Wireless Sensor network Based on Zigbee Standard", Wireless and Optical Communications, 2006, pp. 1-6.

Thum—Temperature Humidity USB Monitor product literature, Practical Design Group, LLC, http://practsol.com/thum.htm, pp. 1-2, 2004-2008, downloaded Oct. 23, 2008.

USB Tenki: USB Temperature sensors and more product literature, http://www.raphnet.net/electronique/usbtenki/index_en.php, pp. 1-8, 2002-2008, downloaded Oct. 23, 2008.

Zanca et al., "Experimental comparison of RSSI-based localization algorithms for indoor wireless sensor networks," REALWSN'08, Apr. 1, 2008, Glasgow, United Kingdom.

Zhao et al., "Wireless Sensor Networks, An Information Processing Approach," Morgan Kaufmann Publishers, 2004, pp. 117-131.

Abbasi et al., "A survey on clustering algorithms for wireless sensor networks," Computer Communications 30, published 2007, pp. 2826-2841.

Younis et al., "Distributed Clustering in Ad-hoc Sensor Networks: A Hybrid, Energy-Efficient Approach," In Proceedings of IEEE INFOCOM, vol. 1, pp. 629-640, Mar. 2004.

"ZigBee—Wikipedia, the free encyclopedia," available at http:/en.wikipedia.org/wiki/Zigbee, retrieved Dec. 23, 2011.

* cited by examiner

PRESENTING INFORMATION REGARDING CONDITIONS OF AN ENVIRONMENT WITH A VISUAL REPRESENTATION OF THE ENVIRONMENT

BACKGROUND

Temperature monitoring is used in many industries. For example, restaurants and food processing companies that rely on refrigeration equipment to keep their products fresh frequently use temperature monitoring. If a malfunction of the refrigeration equipment is not detected promptly, food could and gets either too hot or too cold, resulting in damage to the food products. For a business that relies on food, such damage could result in a large monetary loss and potentially a serious business disruption.

As another example, companies that operate servers or other computer equipment may also monitor temperature of their equipment. Sometimes, a malfunctioning component of the computer equipment will generate excessive heat. Thus, a temperature increase may indicate a defect that may need to corrected. Also, excessive heat generated by the equipment may cause components to fail because they are operating beyond their proper operating temperature.

Temperature monitoring systems are known. These systems incorporate temperature sensors attached to or mounted near equipment for which temperature is to be monitored. The system responds if the temperature sensor indicates a temperature outside of a normal operating range. One type of response that has been used is to raise an alarm at a facility where the monitored equipment is located. Some systems use bells, flashing lights or other forms of audible or visible indications of an improper operating temperature.

SUMMARY

In one embodiment, there is provided a method of operating a computing device of an environmental monitoring system that monitors at least one condition of an environment. The environmental monitoring system comprises at least one environmental sensor unit disposed in the environment and the computing device and the environment is managed by an operator. The method comprises receiving, at the computing device from the operator, a visual representation of the environment in which the at least one environmental sensor unit is disposed, identifying a position in the visual representation of the environment that corresponds to a location in the environment of a first sensor unit of the at least one environmental sensor unit, and configuring a user interface that presents information regarding the environment. In the method, configuring the user interface comprises configuring the user interface to display the visual representation and display information related to the first sensor unit so as to indicate a relationship between the information and the position corresponding to the location of the first sensor unit.

In another embodiment, there is provided at least one computer-readable storage medium encoded with computer-executable instructions that, when executed by at least one computer, cause the at least one computer to carry out a method of operating a computing device of an environmental monitoring system that monitors at least one condition of an environment. The environmental monitoring system comprises at least one environmental sensor unit disposed in the environment and the computing device. The method comprises receiving, at the computing device from an operator of a plurality of operators from which the computing device is configured to receive information, a visual representation of the environment in which the at least one sensor unit is disposed, identifying a position in the visual representation of the environment that corresponds to a location in the environment of a first sensor unit of the at least one environmental sensor unit, and configuring a user interface that presents information regarding the environment. In the method, configuring the user interface comprises configuring the user interface to display the visual representation and display information related to the first sensor unit so as to indicate a relationship between the information and the position corresponding to the location of the first sensor unit.

In a further embodiment, there is provided an environmental monitoring system that monitors at least one condition of an environment. The environment is managed by an operator. The environmental monitoring system comprises at least one environmental sensor unit disposed in the environment and a computing device. The computing device comprises at least one processor and at least one computer-readable storage medium having encoded thereon processor-executable instructions that, when executed by the at least one processor, cause the at least one processor to carry out a method. The method comprises receiving, at the computing device from the operator, a visual representation of the environment in which the at least one sensor unit is disposed, identifying a position in the visual representation of the environment that corresponds to a location in the environment of a first sensor unit of the at least one environmental sensor unit, and configuring a user interface that presents information regarding the environment. In the method, configuring the user interface comprises configuring the user interface to display the visual representation and display information related to the first sensor unit so as to indicate a relationship between the information and the position corresponding to the location of the first sensor unit.

In another embodiment, there is provided a method comprising installing in an environment at least one sensor unit to monitor at least one condition of the environment, communicating to a computing device a visual representation of the environment, and communicating to the computing device information identifying a location in the environment of a first sensor unit of the at least one sensor unit.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
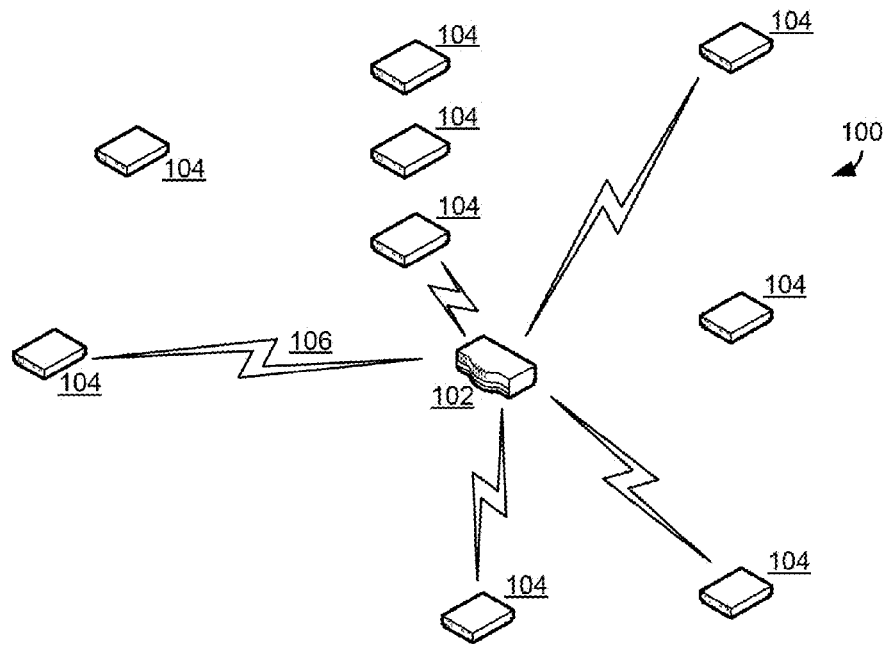
FIGS. 1A and 1B are illustrations of an exemplary environmental sensor network that may be used in an environment.

Applicant has recognized and appreciated that an environmental monitoring system may be more valuable with a user interface that presents information regarding an environment being monitored in conjunction with a visual representation of the environment. More particularly, Applicant has recognized and appreciated that an environmental monitoring system may be more useful to operators of environments and the information regarding the environments may be easier to understand when the environmental monitoring system is coupled with a user interface that is simple to create and provides a visual representation of the environment.

Interfaces for presenting data regarding an environment have been limited to presenting this data in a list or table format, with each row of the list or table presenting information regarding sensors in the environment. To aid users in understanding such lists and tables, vendors who created the interfaces would allow users to specify labels for sensors and the labels would be displayed in the row of the list or table.

Applicants have recognized and appreciated that such lists and tables are disadvantageous for a variety of reasons. First, users may have difficulty remembering a meaning of a label applied to a sensor and may therefore have difficulty understanding how the data for the sensor unit relates to the environment being monitored. Second, such lists and tables may become large and difficult to review when the environmental monitoring system includes a large number of sensor units, which also may complicate a user's ability to understand how the displayed data relates to the environment being monitored. This may be particularly problematic for lay users who are unfamiliar with environmental monitoring systems but wish to use a system to monitor an environment.

Applicants have recognized and appreciated the advantages of an environmental monitoring system with a user interface that is simple to create and includes a visual representation of the environment. For example, a user interface that includes a visual representation of the environment might also include graphics corresponding to sensor units, which are in the environment, placed in the visual representation at positions corresponding to the locations of the sensor units in the environment. Such an interface can display an association between real-world locations and information collected by the environmental monitoring system, which can aid a user identifying a source of the information collected regarding one or more conditions of an environment.

Described herein are techniques for creating a user interface by which a user can view information regarding an environment, which may be any information detected by sensor units of an environmental monitoring system or derived from information detected by sensor units. In some embodiments, an environmental monitoring system comprises one or more sensor units disposed in an environment and one or more servers. The environment in which the sensors are disposed may be managed by an operator. The servers may receive from the operator a visual representation of the environment, which could be a photograph or illustration of the environment, and may also receive information identifying a location of one or more sensor units in the environment. The servers may identify a position in the visual representation corresponding to the location and configure a user interface to present information regarding the environment based at least in part on the positions. The user interface can be configured to display the visual representation and display information related to the first sensor unit so as to indicate a relationship between the information and the position corresponding to the location of the first sensor unit. In some embodiments, information identifying a location of one or more sensor units may be determined through a process that is partially or totally automated by the environmental monitoring system. In other embodiments, information identifying a location of one or more sensor units may be provided manually by an operator.

The techniques described herein may be implemented in any suitable manner. Described below are exemplary implementations of these techniques, though these examples are merely illustrative of the various ways in which embodiments may operate. It should be appreciated that embodiments are not limited to operating in accordance with these examples.

In some examples below, an environmental monitoring system is described that monitors a temperature of an environment. It should be appreciated, however, that embodiments may monitor any suitable conditions of an environment and that embodiments may monitor other conditions in addition to or instead of monitoring temperature. A condition of an environment may include any suitable characteristic of the environment that may be monitored, such as meteorological characteristic of the environment. An environment could be any suitable area including liquids, gases, and/or solids that may be inside a building and/or outside a building. The conditions of any liquids, gases, or solids of the environment can be monitored as conditions of the environment. Temperature, air quality, and moisture levels are examples of environmental conditions that may be monitored.

Further, in some examples below, an environmental monitoring system is described that is disposed in an environment that includes the interior of a building. It should be appreciated, however, that embodiments are not limited to operating in any particular environments and that environmental monitoring systems may be implemented that monitor conditions in environments that are indoors, outdoors, or a combination of indoors and outdoors.

Exemplary environmental sensor networks and exemplary environmental monitoring systems are described below in connection with FIGS. 1A, 1B, and 2. However, it should be appreciated that embodiments are not limited to operating with any specific sensor units, sensor networks, or monitoring systems. In some embodiments, the sensor units and monitoring systems may be implemented in accordance with the sensor units and monitoring systems disclosed in U.S. Pat. No. 7,952,485, titled "Remote Monitoring System" and filed on Nov. 21, 2008, and disclosed in U.S. Patent App. Publication No. 2010/0127881, titled "Remote Monitoring System" and filed on Nov. 21, 2008, each of which is hereby incorporated by reference in their entirety and at least for their discussion of sensor units and monitoring systems.

Figure 1B:
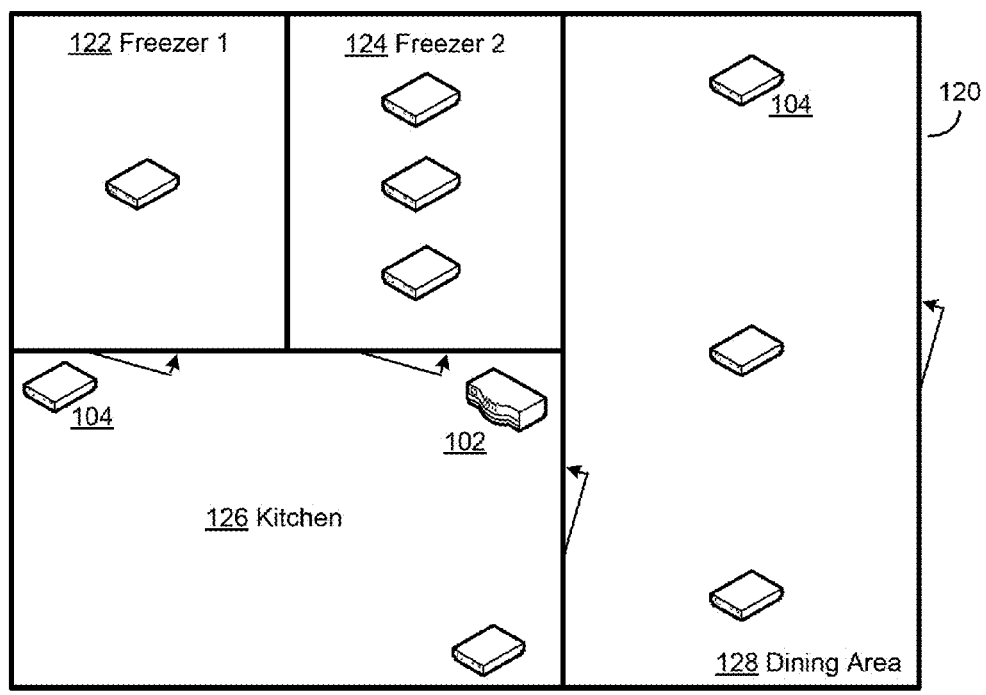

FIG. 1A illustrates an example of an environmental sensor network of an environmental monitoring system with which some embodiments may operate. An environmental sensor network collects data regarding at least one condition of an environment in which the environmental sensor network is located. The environmental sensor network 100 of FIG. 1A includes at least one base station 102 and multiple sensor units 104 that monitor and collect data regarding at least one condition of an environment in which the network 100 is disposed. The base station 102 is capable of communicating wirelessly, via a wireless signal 106, with each of the sensor units 104, and acts as a relay device to communicate information about and from the sensor units 104 to other computing devices outside the environment using a wired and/or wireless communication medium. The base station 102 may be any suitable computing device, including a device that is dedicated to wirelessly relaying information received from sensor units 104 or a device that is capable of wirelessly relaying information received from sensor units 104. In some embodiments, for example, the base station 102 may be a cellular telephone and may be able to make telephone calls, send/receive text messages, and relay information received from sensor units 104 via a wireless cellular communication channel.

The base station 102 may communicate wirelessly with the sensor units 104 in any suitable manner, such as via a low-power wireless communication protocol that has limited range. A low-power protocol with limited range may not transmit information outside the environment in which the network 100 is disposed. Examples of such low-power protocols include Wireless Personal Area Network (WPAN) protocols and Wireless Local Area Network (WLAN) protocols. Examples of WPAN protocols that may be used in embodiments include the BLUETOOTH™ and ZIGBEE® protocols, though any suitable WPAN protocol may be used. Examples of WLAN protocols that may be used in embodiments include any protocols of the Institute of Electrical and Electronics Engineers (IEEE) 802.11 protocol suite, though any suitable WLAN protocol may be used. It should be appreciated, though, that embodiments that use a low-power protocol to communicate between the base station 102 and sensor units 104 are not limited to using WPAN or WLAN protocols, or any of the examples of such protocols mentioned above, but rather may use any suitable low-power protocol, as embodiments are not limited in this respect.

Any suitable information may be communicated between the base station 102 and the sensor units 104. For example, as discussed in detail below, the information may be communicated as part of determining a location of a sensor unit 104 in an environment in which the environmental sensor network 100 is disposed. As another example, the sensor units 104 may communicate to the base station 102 information regarding one or more environmental conditions being monitored. Where information regarding environmental conditions is transmitted, any suitable information may be transmitted in any suitable format, as embodiments are not limited in this respect. In some embodiments, the sensor units 104 may collect data regarding a condition and send that data as the information transmitted to the base station 102, while in other embodiments the sensor units 104 may process collected data in some manner and transmit results of the processing as information regarding a condition to the base station 102.

While the exemplary environmental sensor network 100 of FIG. 1A includes a base station 102 for relaying information from the sensor units 104 to devices outside the sensor network and outside the environment, embodiments are not limited to operating with base stations. In other embodiments, each of the sensor units 104 may include components for communicating information to devices outside of the network and outside of the environment and the sensor network. In some of the embodiments where sensor units are able to communicate outside the sensor network and outside the environment, the environmental sensor network may not include a base station, though in other embodiments one or more base stations may be provided in the sensor network.

An environmental sensor network of the type illustrated in FIG. 1A may be used in any suitable environment to monitor conditions of the environment. FIG. 1B illustrates the network 100 disposed in environment 120 that is a restaurant. The environment 120 includes freezers 122, 124, a kitchen 126, and a dining area 120 and the sensor units 104 of the network 100 are disposed various locations in the environment 120 to monitor conditions at multiple locations of the environment. In the restaurant context, environmental conditions such as temperature can be important to monitor, particularly in connection with the freezers 122, 124 as the freezers 122, 24 may store supplies for the restaurant that might spoil if the temperature in the freezers 122, 124 strays outside acceptable operating ranges. To monitor temperature in the freezers, one sensor unit (in the case of freezer 122) or multiple sensor units (in the case of freezer 124) that are adapted to monitor temperature may be placed within the freezers 122, 124 and may collect data regarding the temperature. Information regarding the temperature may then be communicated from the sensor units to the base station 102 via a wireless signal. Other sensor units at other locations in the environment 120 may also collect data regarding environmental conditions in the rooms of the restaurant in which the sensor units are located and provide that information to the base station 102.

The base station 102 may take any suitable actions in response to receiving information on conditions of the environment from the sensor units 104. In some embodiments, the base station 102 may store the received information in a data store of the base station 102, such as a database that is maintained as a component of the base station 102. Additionally or alternatively, the base station 102 may transmit the information to a remote data store via a communication network using a connection-oriented or connectionless communication protocol. The remote data store to which the information is transmitted, which may be outside the environment in which the sensor network 100 is disposed, may be associated with the environmental sensor network 100, in that the remote data store may form, together with the sensor network 100, a part of an environmental monitoring system.

Figure 2:
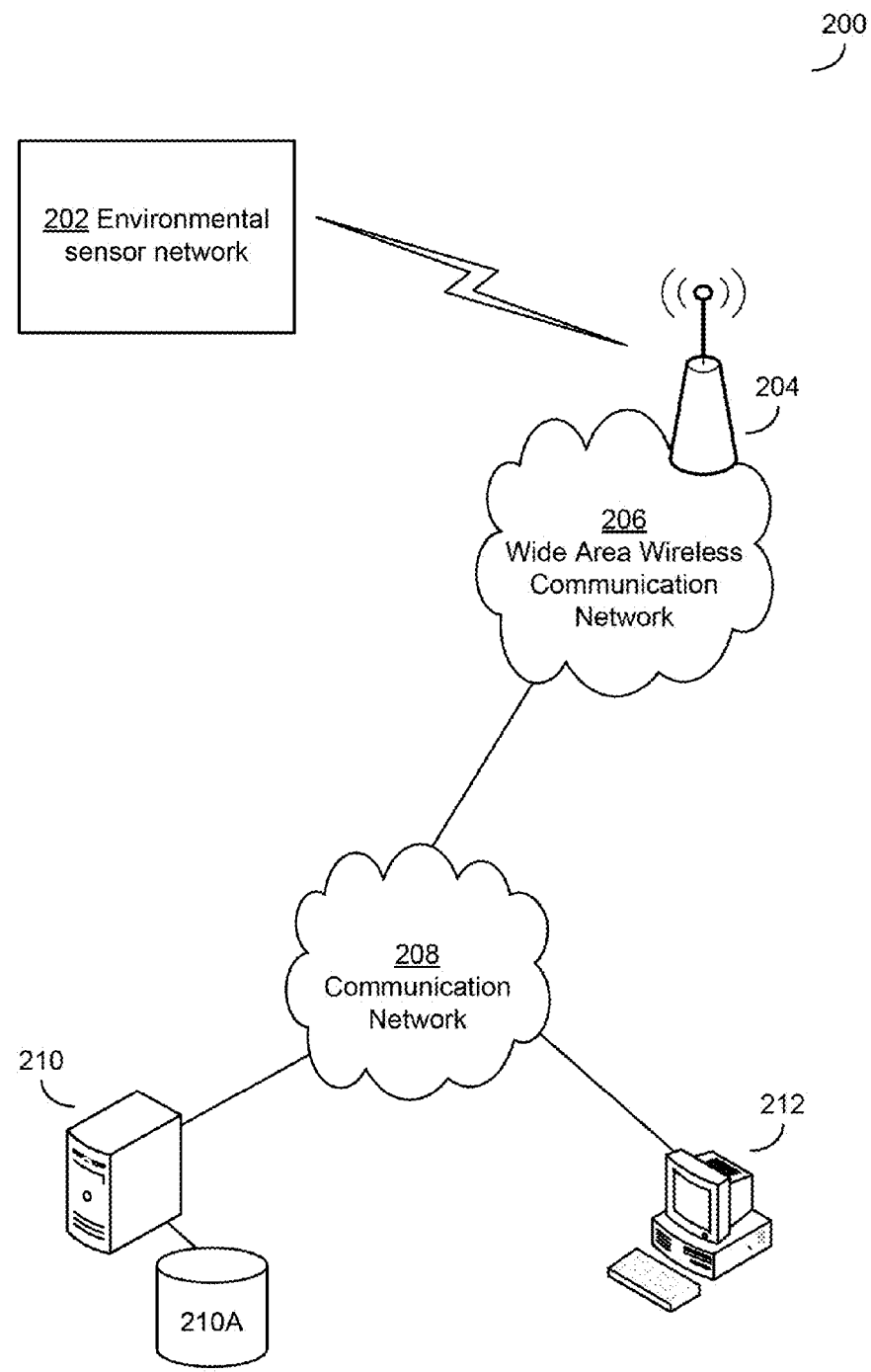
FIG. 2 is an illustration of an exemplary environmental monitoring system that may be used in some embodiments.

FIG. 2 illustrates an example of an environmental monitoring system with which some embodiments may operate. An environmental monitoring system includes at least one environmental sensor network, stores information for the environmental sensor network(s), and provides the information to users. Where an environmental monitoring system includes multiple environmental sensor networks, the environmental sensor networks may be placed within a same environment or different environments. Where there are different environments, the different environments may be managed by multiple different operators. Accordingly, an environmental monitoring system may, in some embodiments, store information regarding environments for multiple different operators.

The environmental monitoring system 200 includes an environmental sensor network 202 that may be disposed in an environment to monitor conditions in an environment and one or more servers 210 that are associated with a data store 210A. The environmental sensor network 202 may provide to the server(s) 210 and the data store 210A information that is communicated between sensor units and base stations, including information regarding conditions in the environment in which the network 202 is disposed.

To transmit the information to the server(s) 210, the environmental sensor network 202 may transmit the information regarding the conditions via at least one communication network. The transmission may be carried out in any suitable manner, as embodiments are not limited in this respect. In the example of FIG. 2, base stations of the environmental sensor network 202 transmit the information regarding the conditions in the environment to the server(s) 210 via a wireless communication protocol, which may be a high-power wireless communication protocol that is capable of transmitting information outside of the environment in which the environmental sensor network 202 is disposed. Such a high-power wireless protocol may be a Wireless Wide Area Network (WWAN) protocol. As illustrated in FIG. 2, the environmental sensor network 202 may transmit a wireless signal to an antenna 204 of a WWAN network 206. In some embodiments, the WWAN network 206 may be a cellular communication network and the antenna 204 may be a cell tower of the cellular communication network. In such embodiments, a base station of the environmental sensor network may include components to permit transmission of information via a cellular communication protocol, such as one of the Global System for Mobile Communications (GSM) protocols. When the antenna 204 receives a communication from the environmental sensor network 202, the antenna may relay the communication to the server(s) 210 via the network 206. Where the server(s) 210 are not connected to the network 206, the information from the sensor network 202 may also be transmitted via another communication network 208 that is any suitable network, including a local area network, an enterprise network, and/or the Internet.

The server(s) 210, upon receiving information from the environmental sensor network 202, may process and/or store the received information in the data store 210A in any suitable manner, as embodiments are not limited in this respect. The information that is received from the sensor network 202 and stored may include any suitable information, including information regarding conditions of an environment that the network 202 is monitoring and information regarding locations of sensor units of the environmental sensor network 202. The information may be stored for processing and/or review by an analysis facility, such as a facility that reviews the information and determines whether to raise an alert based on the review (e.g., when a temperature strays outside an acceptable operating range), and/or for review by a user who views the information via a user interface.

A user may operate a computing device 212 to communicate with the server(s) 210 to request information regarding the conditions of the environment and the server(s) 210 may respond to the request by presenting, via the computing device 212, a user interface to display the information stored in the data store 210A. The user may thereby view the information regarding conditions of the environment and take any suitable action based on the information. The user may be any suitable person authorized to view the information regarding the environment, such as a person associated with an operator of the environment. The operator of the environment may be a manager of the environment in which the sensor network 202 is disposed and may have placed the sensor network 202 in the environment or had the sensor network 202 placed in the environment. The operator of the environment may be any suitable entity that may manage an environment, such as a commercial or non-commercial entity or a human that owns and/or is responsible for the environment. A user that is associated with the operator may be the operator or may be a person affiliated with the operator, such as an employee, friend, or relative of the operator. Upon viewing the information regarding the conditions of the environment, the operator may perform various management operations based on the information, such as adjusting climate control of a room being monitored or other actions. Embodiments are not limited to working with users and/or operators that take any particular action based on information presented via the user interface.

The user interface by which the information is presented may be any suitable user interface. For example, in some embodiments, the user interface may include one or more web pages of a web site. Embodiments are not limited to presenting a user interface that includes any particular content or is in any particular format. Though, as discussed above, in some embodiments the user interface by which information regarding conditions of an environment is displayed includes a visual representation of the environment. Such a visual representation of the environment may aid a user in understanding information regarding conditions in the environment that is presented via the user interface. For example, in the illustrative environmental sensor network of FIGS. 1A and 1B, a visual representation of the restaurant of FIG. 1B may be displayed in a user interface. Such a visual representation may be any suitable likeness of the environment, including an illustration or photograph. Thus, in one embodiment, the illustration of FIG. 1B may be displayed in a user interface as a visual representation of the restaurant in which the exemplary sensor network is disposed. Other examples of user interfaces are discussed below in connection with FIGS. 9A-9C.

Where the user interface includes a visual representation of the environment, when information that is related to data collected by a sensor unit of the sensor network 202 is to be displayed in the environment, a relationship between the sensor unit and the information may be displayed in the user interface. The relationship between the sensor unit and the information may be displayed in various ways, as discussed in detail below. For example, in some embodiments, the information related to data collected by a sensor unit may be displayed at or near a position in the visual representation of the environment that corresponds to a location of the sensor unit in the environment. Exemplary user interfaces, techniques for configuring user interfaces, and techniques for operating environmental monitoring systems that use such user interfaces are described in detail below in connection with FIGS. 3-9C.

Figure 3:
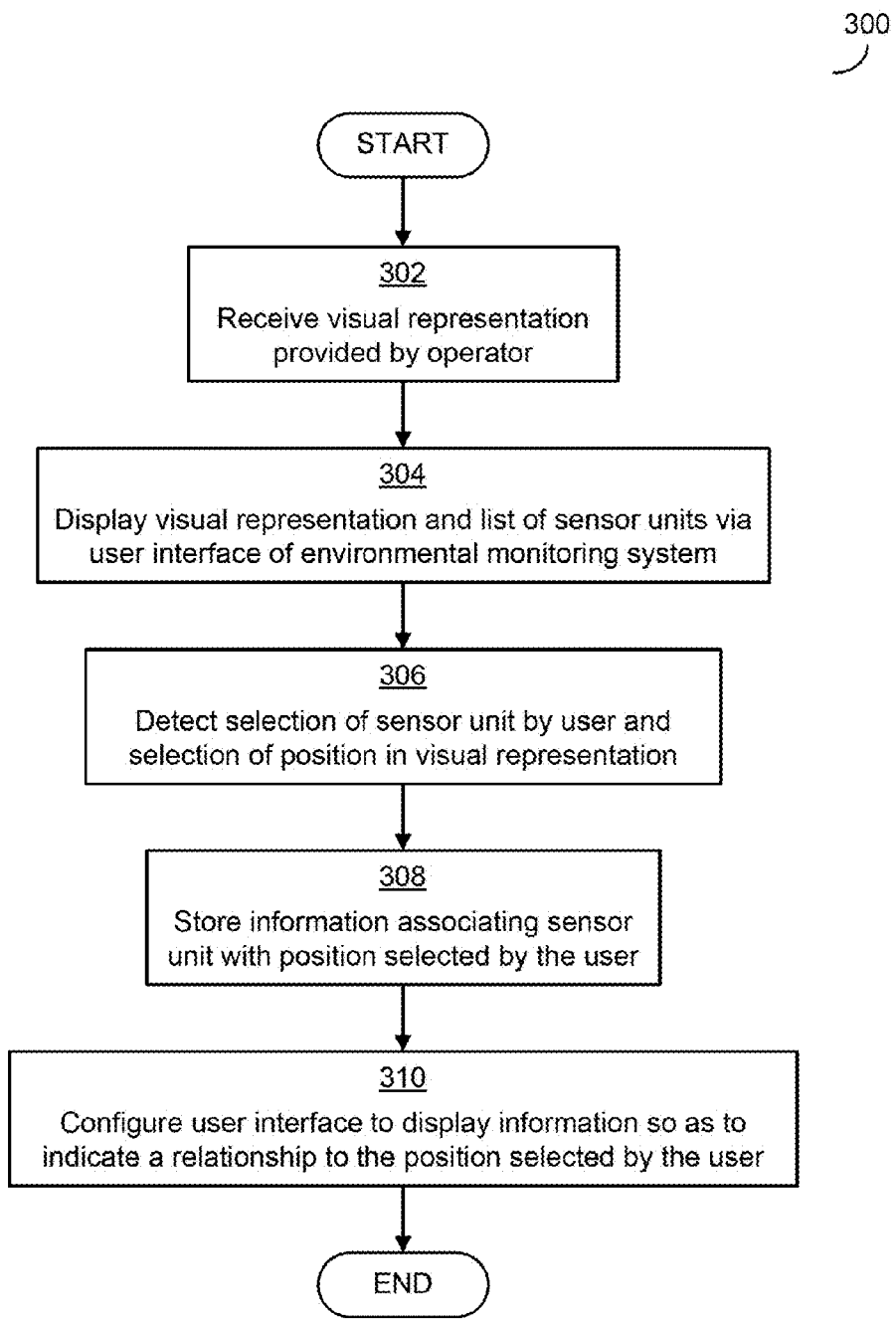
FIG. 3 is a flowchart of an exemplary technique for configuring an environmental monitoring system to display collected data using a visual representation of an environment.

FIG. 3 shows one exemplary technique that may be used in some embodiments to operate an environmental monitoring system to convey information regarding at least one condition of an environment via a user interface that includes a visual representation of the environment.

Prior to the start of the process 300, an environmental sensor network is placed in an environment that is managed by an operator and the environmental sensor network is placed in communication with a server of an environmental monitoring system. The sensor network may be in communication with the server in any suitable way, including by a Wireless Wide Area Network (WWAN) connection between the sensor network and the server.

The process 300 of FIG. 3 begins in block 302, in which the server of the environmental monitoring system receives from an operator a visual representation of the environment in which the sensor network is placed. The visual representation may be received from the operator when a user provides the visual representation and the user is the operator or is affiliated with the operator. The visual representation of the environment that the server receives may be any suitable visual representation, including an illustration or a photograph that is of all or a part of the environment. The server may receive the visual representation in a digital format, such as via a file in an image file format like the Joint Photograph Experts Group (JPEG) file format or another image file format. The visual representation may include any suitable information about the environment. In some cases, the visual representation may identify contents of the environment, such as objects in the environment, and may identify structural elements of the environment, such as walls, buildings, or other structures in the environment.

The server may receive the visual representation via any suitable means. In some embodiments, the server receives the visual representation in the digital format via a communication network, such as in response to the operator uploading the visual representation to the server. To upload the visual representation, in some embodiments the user may interact with the environmental monitoring system via a user interface displayed on a computing device used by the user. Such a user interface may be one or more web pages of a website or may be any other suitable user interface. As part of the interacting with the user interface, the user may provide the visual representation to the interface and request that the interface upload the visual representation.

When regarded as having a coordinate system (such as a two-dimensional or three-dimensional coordinate system, based on the nature of the visual representation), the visual representation of the environment includes various positions. Each of the positions in the visual representation of the environment correspond to actual, physical locations in the environment. As discussed above, a user may better understand information regarding conditions of the environment when the information is presented in a way that indicates a relationship to a location in the environment. One way a user interface may display the relationship between information and a location in the environment is to display the information at a position in the visual representation that corresponds to a location of a sensor unit in the environment. For example, when the information regarding the conditions relates to data collected by a sensor unit, the information may be displayed at a position in the visual representation corresponding to the location of the sensor unit.

To display the information at a corresponding position, the user interface of the environmental monitoring system has to know what position in the visual representation corresponds to the location of the sensor unit. In the exemplary process 300 of FIG. 3, the user informs the environmental monitoring system of the corresponding position.

In block 304, therefore, once the visual representation has been received, the visual representation may be displayed to the user via a user interface along with a list of sensors units that form a part of the environmental sensor network disposed in the environment. As with the user interface of block 302, the user interface of block 304 may be any suitable interface, including one or more web pages of a website. The user may interact with the user interface to select a sensor unit from the list and select a position in the visual representation to indicate that the sensor unit has a location that corresponds to the selected position.

Accordingly, in block 306 the environmental monitoring system detects a selection by the user of a sensor unit in the list and the selection of a position in the visual representation. The user may be aware of a location of the sensor unit in the environment either through the user's prior knowledge or through an inspection of the environment or the environmental sensor network of the environment. To aid in selection of sensor units, in some embodiments the list that is displayed in block 304 may include identifying information for each of the sensor units, such as a label that has been assigned to the sensor unit. The selection of the position in the visual representation may be carried out in any suitable manner. In some user interfaces, for example, a user may move a computer mouse pointer over the visual representation displayed in the user interface and click at a position in the visual representation to select the position. Embodiments may detect a selection of a position in any suitable manner, though, as embodiments are not limited in this respect.

In block 308, once the selections of block 306 are detected, the environmental monitoring system may store information associating the selected sensor unit with the selected position and, in block 310, may configure a user interface to display information related to the sensor unit so as to indicate a relationship to the selected position. The storing and configuring of blocks 308, 310 may be carried out in any suitable manner. In some embodiments, the information may be stored in block 308 by storing a pair of an identifier for a sensor unit and an identifier for the position in a list of one or more pairs. The user interface may be configured in block 310 to display the information by reviewing the list of sensor unit-position pairs such that, when information related to a sensor unit is to be displayed, the position corresponding to the location of the sensor unit is retrieved from the list of pairs and used in displaying the information. In other embodiments, the user interface may be configured by creating user interface elements that will be displayed at the position in the visual representation. For example, text boxes to display information, a graphic indicating the sensor unit, or other user interface elements may be created for display at the position. The way in which the user interface is configured in block 310 may vary depending on the manner in which the information is to be displayed in the user interface. The information may be displayed in any of various ways, as discussed below in connection with FIGS. 8-9C.

Once the user interface is configured in block 310, the process 300 ends. As a result of the process 300, the server of the environmental monitoring system is configured to display information that is related to data collected by a sensor unit at a position in the user interface that corresponds to a location of the sensor. The server stores the visual representation of the environment that was received from the operator and stores information relating a position in the visual representation to a location in the environment. Subsequently, a user may operate a computing device to interact with the server and receive from the server the user interface including the visual representation and view, via the user interface, information regarding one or more conditions of the environment.

In the example of FIG. 3, a user provides an explicit input regarding which positions of the visual representation of the environment correspond to locations of sensor units of an environmental sensor network disposed in the environment. Embodiments are not limited to accept explicit input from a user. Rather, in some embodiments, a determination of a position in a user interface that corresponds to a location of a sensor unit may be partially or totally automated. FIGS. 4-8 illustrate techniques that may be used to determine a position corresponding to a location of a sensor unit using automated techniques and sensor units that may be used in some embodiments.

Figure 4:
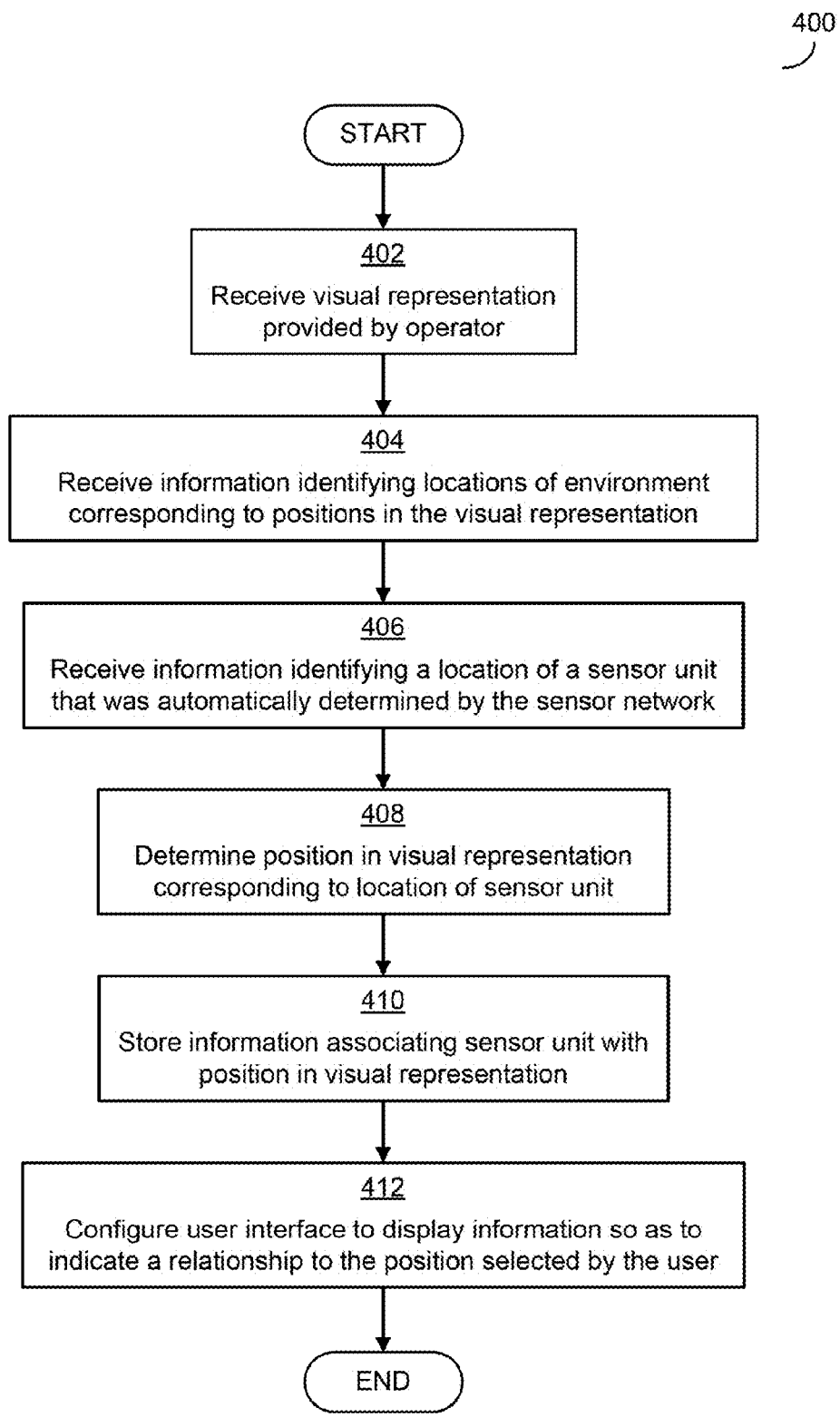
FIG. 4 is a flowchart of another exemplary technique for configuring an environmental monitoring system to display collected data using a visual representation of an environment.

FIG. 4 shows one exemplary technique that may be used in some embodiments to operate an environmental monitoring system to convey information regarding at least one condition of an environment via a user interface that includes a visual representation of the environment.

Prior to the start of the process 400, an environmental sensor network is placed in an environment that is managed by an operator and the environmental sensor network is placed in communication with a server of an environmental monitoring system. The sensor network may be in communication with the server in any suitable way, including by a Wireless Wide Area Network (WWAN) connection between the sensor network and the server.

The process 400 of FIG. 4 begins in block 402, in which the server of the environmental monitoring system receives a visual representation provided by an operator. The receiving of block 402 of FIG. 4 may be carried out in any suitable manner, including as discussed above in connection with block 302 of FIG. 3.

As discussed above, when viewed as having a coordinate system, the visual representation received by the server includes positions corresponding to locations in the environment. However, the server receiving the visual representation may be unaware of a correspondence between the positions of the visual representation and the locations of the environment. As part of performing an automated or partially automated process for determining positions in the visual representation that correspond to locations of sensor units, the server receives in block 404 information identifying locations of the environment that correspond to positions in the visual representation. The information that is received in block 404 may be any suitable information for the server to determine a correspondence between locations in the environment and positions in the visual representation. For example, where the visual representation is a two-dimensional view of the environment, the information received in block 404 may be an indication of two points in the visual representation and a location in the environment corresponding to each. The two points may be any two points, such as two corners of the visual representation or two points within the visual representation. In the case of the two-dimensional view, once the server is aware of the locations corresponding to the two points, the server can infer a correspondence between the coordinate system of the visual representation and a coordinate system of the environment to determine locations corresponding to other positions. In visual representations that are other than two-dimensional views, such as three-dimensional views or other views, other information may be received to determine the correspondence.

In block 406, the server receives from the environmental sensor network information identifying a location in the environment of a sensor unit. The information identifying the location has been determined using an automated and/or partially automated localization process, as discussed in further detail below. The information may identify the location in any suitable manner, including by identifying the location of the sensor unit relative to a fixed location in the environment, such as the location of a base station, or by identifying a geographic location of the sensor unit, such as by a latitude and longitude for the sensor unit.

In block 408, once the information identifying the location of a sensor unit is received, then the server may consult the mapping between positions and locations that was determined based on the information received in block 404. By consulting the mapping using the information received in block 406, the server can identify a position in the visual representation that corresponds to the location of the sensor unit. Once the position is determined, then in block 410 information regarding the position is stored and, in block 412, the user interface is configured based on the information. The storing and configuring of blocks 410, 412 may be carried out in any suitable manner, including according to techniques discussed above in connection with blocks 308, 310 of FIG. 3.

Once the user interface is configured in block 412, the process 400 ends. As a result of the process 400, the server of the environmental monitoring system is configured to display information that is related to data collected by a sensor unit at a position in the user interface that corresponds to a location of the sensor. The server stores the visual representation of the environment that was received from the operator and stores information relating a position in the visual representation to a location in the environment. Subsequently, a user may operate a computing device to interact with the server and receive from the server the user interface including the visual representation and view, via the user interface, information regarding one or more conditions of the environment.

Figure 5:
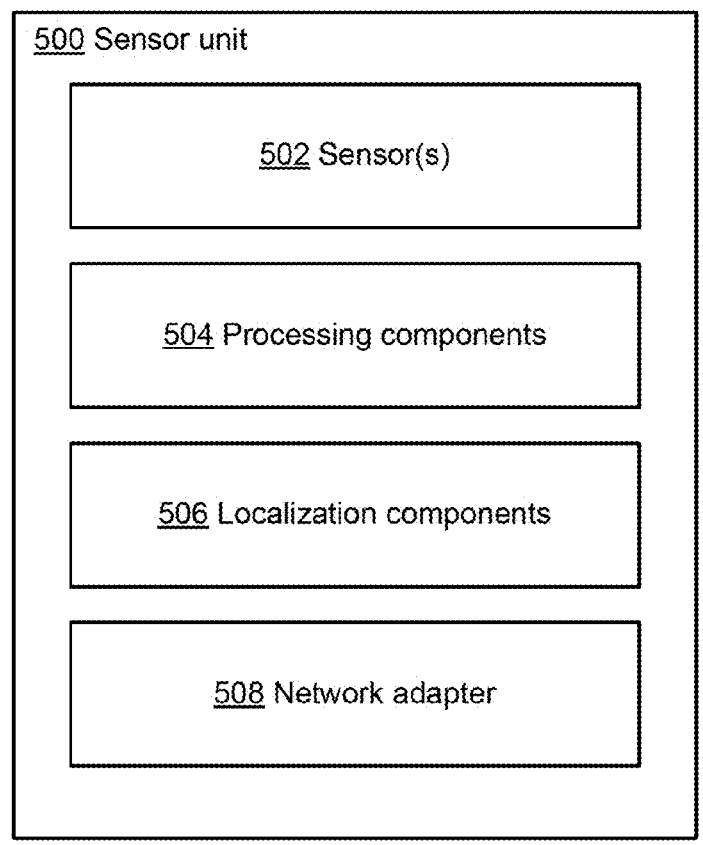
FIG. 5 is a block diagram of an exemplary a sensor unit with which some embodiments may operate.

As mentioned above, embodiments are not limited to operating with any particular sensor units. FIG. 5 is a block diagram of some components of a sensor unit with which some embodiments that localize a sensor unit using an automated or partially automated process may operate.

The sensor unit 500 of FIG. 5 includes various components for collecting information regarding one or more conditions of an environment in which the sensor unit is disposed. In the example of FIG. 5, these components include one or more sensors 502 that collect data regarding the conditions and processing components 504 that process at least some of the data collected by the sensors 502. Information regarding the conditions, which may include data collected by the sensors 502 and/or processed by the processing components 504, may be communicated from the sensor unit 500 via a network adapter 508. The network adapter 508 may transmit the information in any suitable manner, such as by transmitting the information via a WPAN or WLAN communication protocol and/or, in some embodiments, via a WWAN communication protocol.

As illustrated in FIG. 5, in addition to the information-collection components 502, 504, and the network adapter 508, the sensor unit 500 includes localization components 506. The localization components 506 may include any suitable hardware and/or software that may be used by the sensor unit 500 as part of determining a location of the sensor unit 500. In some embodiments, the localization components 506 may determine a location of the sensor unit 500. For example, the localization components 506 may receive one or more signals, such as one or more signals from a global navigation system or from other components of an environmental sensor network or environmental monitoring system (e.g., from other sensor units, base stations, or servers), and perform operations based on the signals to determine a location of the sensor unit. In other embodiments, the localization components 506 may interact with other components of an environmental sensor network or an environmental monitoring system to aid the other components in determining a location of the sensor unit 500. Information and signals communicated between devices and components for localization purposes may include any suitable information. For example, a location of other devices and components may be communicated to a sensor unit to aid that sensor unit in determining its location. As another example, as discussed in detail below, in some embodiments the localization components 506 may transmit probe messages to a base station of an environmental sensor network so that the base station and/or a server of an environmental monitoring system can determine the location of the sensor unit 500.

The location that can be determined through the localization components 506 may be any suitable location, including a geographic location and/or a location relative to other devices of an environmental sensor network. For example, a latitude/longitude of the sensor unit 500 or a location relative to a location of a base station of an environmental sensor network may be determined through the localization components 506.

FIG. 5 is an illustrative example of an architecture for a sensor unit. In some embodiments, a base station of an environmental sensing network may have a similar architecture. The architecture for a base station may not include sensor(s), as in some embodiments the base station may act as a relay device and may not participate in collecting data regarding conditions of a network. Though, in some embodiments, the base station may be implemented as a sensor unit that includes a component for communicating outside the environment or outside the sensor network. Additionally, even where the base station does not include any sensors, in some embodiments the base station may include processing components for processing data collected by sensors units. Further, the network adapter of a base station may include two adapters: a low-power adapter for communicating with sensor units and a high-power adapter for communicating with a wide-area network that extends beyond the environment. Though, it should be appreciated that embodiments are not limited to operating with any particular type of base station.

Figure 6:
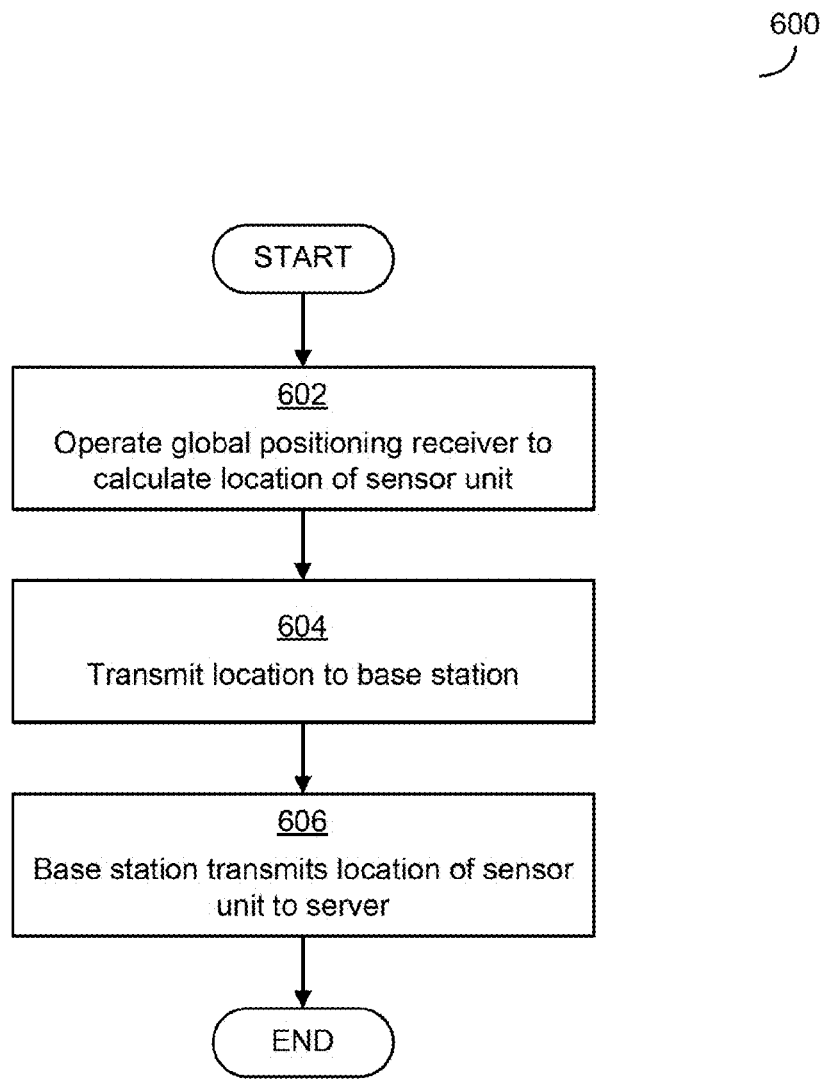
FIG. 6 is a flowchart of an exemplary technique for determining a location of a sensor unit.

FIG. 6 shows one exemplary process that may be carried out by an environmental monitoring system to determine a location of a sensor unit through an automated process. In the example of FIG. 6, localization components of the sensor unit determine the location of the sensor unit based on signals from the Global Positioning System (GPS). Prior to the start of the process 600, the sensor unit and a base station are placed in an environment managed by an operator and placed in wireless communication with each other and with a server of the environmental monitoring system.

The process 600 begins in block 602, in which a global positioning receiver of the localization components of the sensor unit calculates, based on GPS signals received by the global positioning receiver, a location of the sensor unit. The calculation performed by the global positioning sensor in block 602 can be performed in any suitable manner, including according to GPS techniques that are known or will be known, as embodiments are not limited in this respect.

In block 604, after the location of the sensor unit has been calculated in block 602, the sensor unit transmits the information identifying the location to a base station of an environmental sensor network. After the base station receives the information identifying the location, in block 606 the base station transmits the information identifying the location to a server, after which the process 600 ends. Once the server receives the information identifying the location as a result of the transmission of block 606, the server may use the information identifying the location as part of identifying positions in a visual representation that correspond to locations of sensor units in the environment, as discussed above in connection with blocks 406-412 of FIG. 4.

Figure 7:
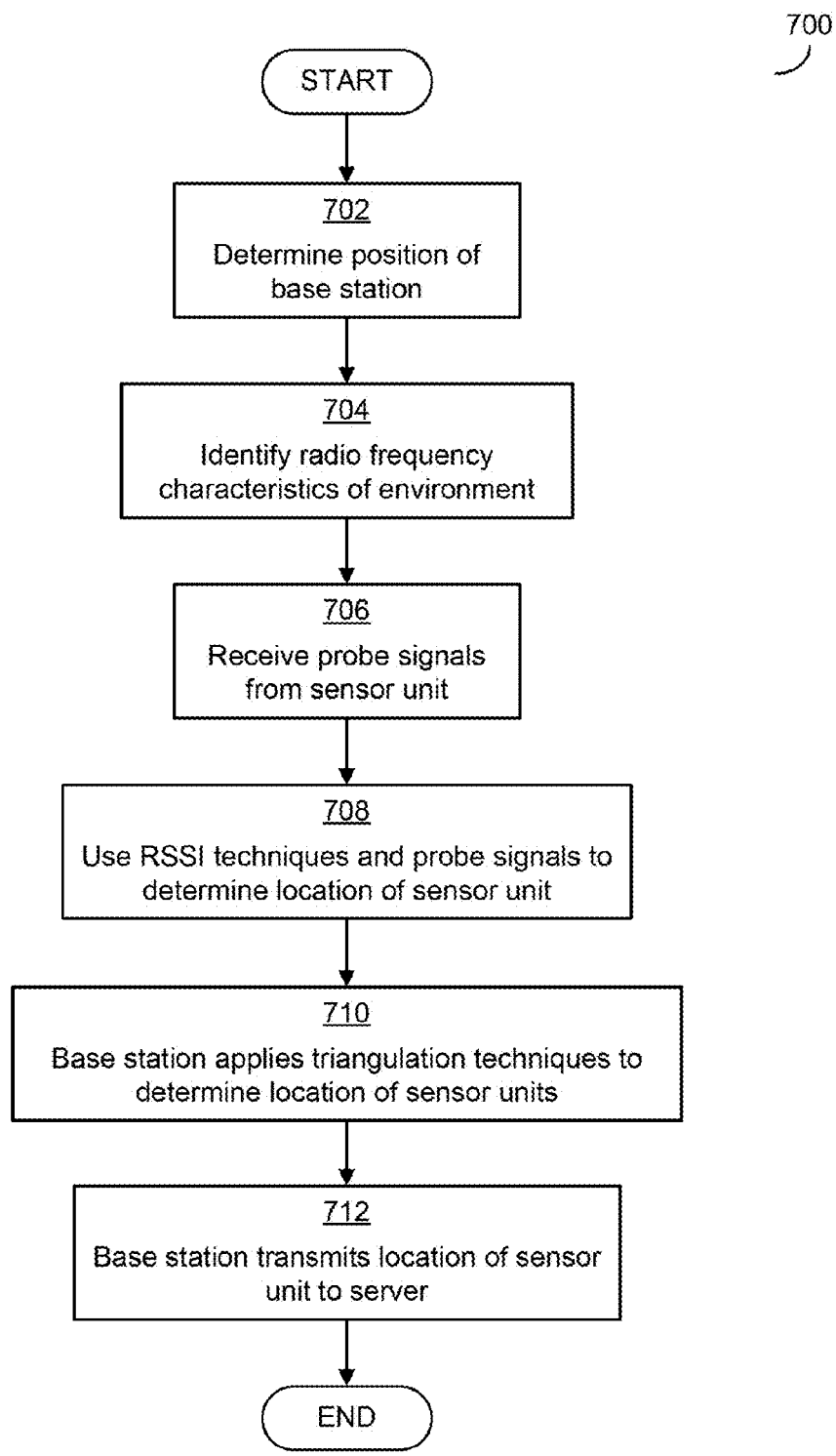
FIG. 7 is a flowchart of an exemplary technique a base station may carry out to determine a location of a sensor unit.

As mentioned above, while some embodiments may operate localization components of a sensor unit to determine a geographic location of the sensor unit, other embodiments are not limited to carrying out a localization process in this manner. In other embodiments, a localization process may be carried out on a base station and/or on a server based on signals received by the base station from the sensor unit to determine a location of the sensor unit relative to the location of the base station. FIG. 7 illustrates an example of such a process that may be performed by a base station. It should be appreciated, however, that in some embodiments processing and calculations described in FIG. 7 as being carried out by the base station may, in other embodiments, be carried out on a server and/or a sensor unit. For ease of description, the process 700 is described as being performed by the base station.

The process 700 of FIG. 7 begins in block 702, in which the base station determines the location of the base station. The base station may determine its location in any suitable manner, including through receiving a user's specification of the location of the base station or through calculations based on GPS signals received at a global positioning receiver of the base station.

By identifying the location of the base station, the base station can be used as an "anchor node" in a localization process that applies Received Signal Strength Indication (RSSI) techniques to determine a location of "unknown nodes" (i.e., nodes having an unknown location) that are sensor units of the environmental sensor network. The RSSI localization process can be performed by the base station based on properties of signals received at the base station from the sensor unit.

RSSI localization processes, including RSSI localization processes that apply triangulation techniques, are known in the art and a detailed discussion of RSSI is not necessary herein. However, a brief description of RSSI techniques and triangulation is provided below.

RSSI techniques can be used to perform localization based on the characteristics of received signals, such as the amplitude of received signals. Where a signal travels unimpeded and without multipath concerns, the signal will attenuate over distance at a known rate and the attenuation of the signal can be used to determine a distance the signal traveled and, thereby, an indication of a location of the transmitter can be determined. Where the signal is transmitted in an environment that includes obstacles such as walls, the signal may be attenuated further by the walls and by multipath fading. It is therefore known in the art to build a model of the radio frequency (RF) characteristics of an environment prior to applying RSSI techniques to signals received in the environment, such that the model can be used to inform the RSSI localization process.

Accordingly, in block 704, the radio frequency characteristics of an environment are identified. The RF characteristics of the environment can be determined in any suitable manner, including according to techniques that are known in the art or will be known in the art. For example, the base station that is carrying out the process 700 may transmit signals to the sensor units and review the responses to the signals to determine the RF characteristics and may request from other base stations of the environmental sensor network of the environment any information regarding those responses, if the responses were received by the other base stations, and any RF characteristics calculated by the other base stations. Through compiling this information on the signals communicated in the environment, the RF characteristics of the environment can be identified.

Once the RF characteristics are identified in block 704, in block 706 the base station communicates with a sensor unit in the environmental sensor network to request that the sensor units transmit one or more probe signals to the base station. Characteristics of the probe signals transmitted by the sensor unit, such as amplitude and phase of the probe signals, may be known in advance to the base station, such that the base station is able to compare a received probe signal to the probe signal that was originally transmitted by the sensor unit. Such a probe signal may, in some embodiments, be transmitted by localization components of the sensor unit that are communicating with the base station.

In block 708, once the probe signals for the sensor unit are received, the base station can apply RSSI techniques to the received probe signals to determine information regarding a location of the sensor unit. The determination of block 708 may be made in any suitable manner using any suitable RSSI technique, and the nature of processing performed in block 708 may vary based on the RSSI technique that is used. In some embodiments, the base station may measure the amplitude of each signal received by the base station from a sensor unit and make a determination of location based on that amplitude. In other embodiments, the base station may request additional information from sensor units and/or other base stations of the environmental sensor network. For example, the base station may request from a sensor unit information regarding an amplitude and/or phase of a probe signal received by the sensor unit from another sensor unit, such that the base station can determine a relative distance between the two sensor units. Similarly, in some embodiments the base station may request information from another base station regarding an amplitude and/or phase of a probe signal from a sensor unit that is received at the other base station, such that the base station can determine a position of the sensor unit relative to both base stations.

In block 710, as part of evaluating probe signals received from the sensor unit and information received from other sensor units and/or base stations, the base station may perform a triangulation technique to aid in determining a location of the sensor unit. RSSI techniques alone may not be sufficient to determine a location of a sensor unit relative to a base station, as the RSSI techniques can estimate a distance of the sensor unit from the base station, but there are many different potential locations of the sensor unit based on that information, as the sensor unit could be anywhere on a circle at that distance from the base station. Triangulation techniques can be used to further constrain the location determined by the base station so as to yield a more specific location of the sensor unit. As mentioned above, triangulation techniques are known in the art and need not be described in detail herein. The triangulation techniques may evaluate information regarding the sensor unit that was received at two or more other nodes in the environmental sensor network, such as other sensor units and/or other base stations, which is communicated to the base station. The information from the other nodes may be used by the base station to triangulate the location of the sensor unit by determining a distance from the sensor unit to each of the three or more nodes of the environmental sensor network.

Once the location of the sensor unit is determined using the RSSI and triangulation techniques in blocks 708, 710, in block 712 the base station transmits the location of the sensor unit to the server, and the process 700 ends. Once the server receives the information identifying the location as a result of the transmission of block 712, the server may use the information identifying the location as part of identifying positions in a visual representation that correspond to locations of sensor units in the environment, as discussed above in connection with blocks 406-412 of FIG. 4.

Techniques have been described for manually specifying a position in a visual representation that corresponds to a location of a sensor unit in an environment and for performing an automated or partially-automated process for identifying a position in a visual representation that corresponds to a location of a sensor in an environment. It should be appreciated, however, that embodiments are not limited to carrying out the exemplary process described above and that other processes are possible.

In the examples described above, a user interface was configured to present information so as to indicate a relationship between the information and a position in a visual representation of an environment. Information can be presented via the user interface in any suitable manner, examples of which are described below in connection with the process 800 of FIG. 8 and the exemplary user interfaces of FIGS. 9A-9C.

Figure 8:
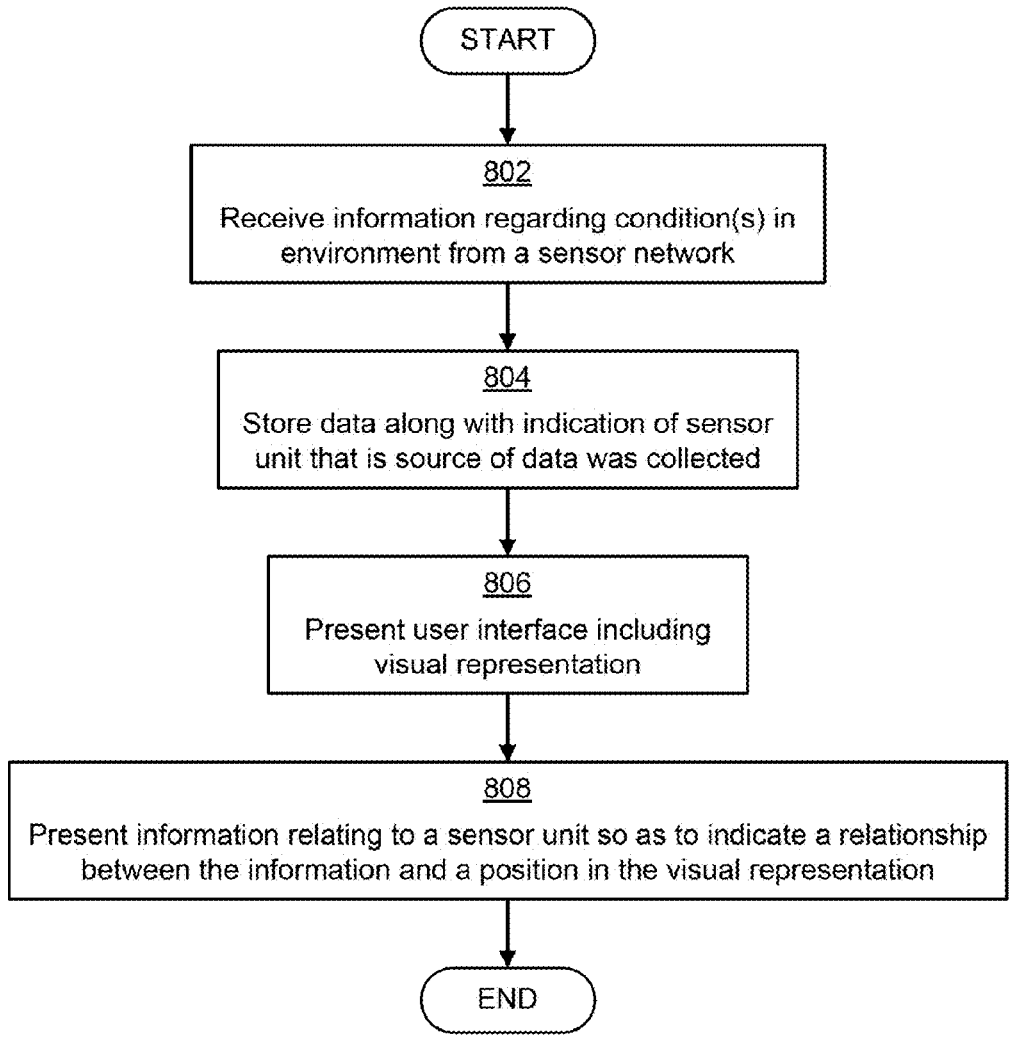
FIG. 8 is a flowchart of an exemplary technique for displaying collected data using a visual representation of an environment.

Prior to the start of the process 800 of FIG. 8, an environmental sensor network is placed in an environment and a user interface for an environmental sensor network is configured based on locations of sensor units in the environment. To collect data regarding conditions of the environment and display information regarding the conditions via the user interface, the process 800 may be carried out.

The process 800 of FIG. 8 begins in block 802, in which a server of an environmental monitoring system receives from an environmental sensor network of the system information regarding at least one condition of the environment in which the environmental sensor network is disposed. The information that is received in block 802 may be any suitable information, including raw data collected by a sensor unit and/or information that results from a processing by the sensor unit and/or base station of raw data. The information that is received in block 802 may include an indication of a source of the information, which may be an identification of a sensor unit that collected the data on which the information is based.

After the server receives the information and, in some cases, processes the information in some manner, the information may be stored in block 804 in a data store of the server along with the indication of the source of the information.

In block 806, when a user requests to view information regarding one or more conditions of the environment, the server may present to the user a user interface that includes a visual representation of the environment in which the environmental sensor network is disposed. Additionally, in block 808, information regarding the conditions of the environment are presented via the user interface. The information may be presented in block 808 in such a manner to indicate a relationship between the information and a position in the user interface that corresponds to a location of the sensor unit that is a source of the information. For example, when information is retrieved from the data store, the indication of the source of the information may also be retrieved. The indication of the source of the data may be used to identify, from stored information regarding locations of sensor units and/or positions corresponding to locations of sensor units, a position in the visual representation that corresponds to a location of the sensor unit that is the source of the information to be displayed. Once the position in the visual representation is identified, the information can be presented via the user interface in a way that indicates a relationship between the information and the position. The relationship between the information and the position can be indicated in any suitable manner. In some embodiments, for example, the information can be displayed in the user interface at or near the position. As another example, a graphic representative of the sensor unit that is a source of the information can be displayed at the position and the information can be displayed in a way that relates the information to the graphic. For example, the information can be displayed connected to the graphic by a line or other graphical element. As another example, the information can be displayed outside of the visual representation, but an association with the graphic at the position may be displayed. For example, a color relationship between the information and the graphic may be used to display the relationship, or the graphic may be highlighted in some way (e.g., made larger or a different color) when the information is displayed and/or selected.

The user interface may be presented in blocks 806, 808 in any suitable manner. In some embodiments, the user interface may be one or more web pages of a website and the server may present the user interface by transmitting the web pages to the user's computing device for display to the user.

Once the information is presented via the user interface, the process 800 ends. Following the process 800, the user interface is presented to a user via a computing device operated by the user, the user may view information regarding conditions of the environment, and the user may take any suitable action regarding the conditions or the environment. For example, where the information regarding the environment includes a temperature for the environment and the user learns via the user interface that a temperature of the environment is outside an acceptable operating range, the user may adjust a climate control of the environment or take any other suitable action.

Figure 9A:
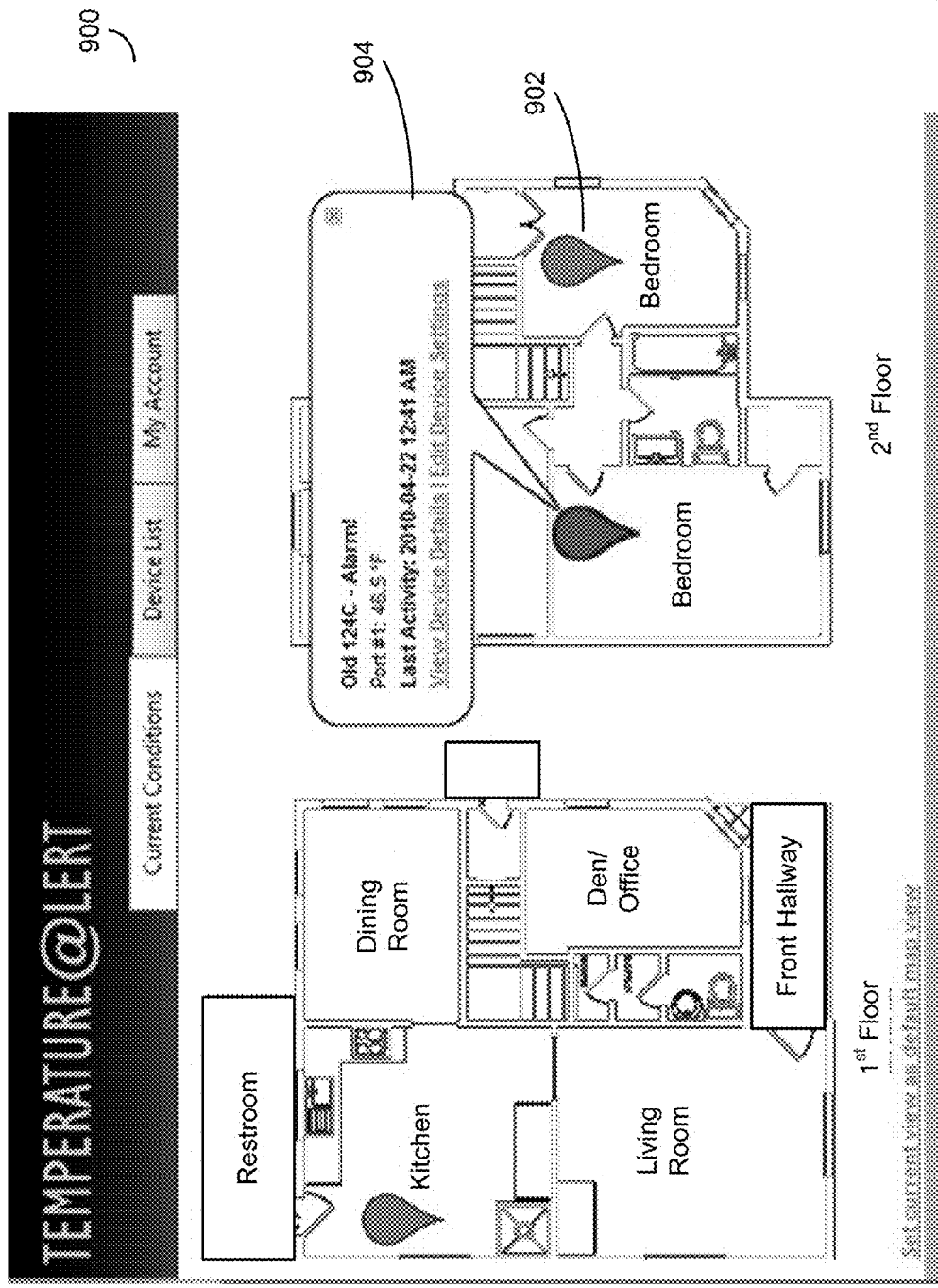
FIGS. 9A, 9B, and 9C are exemplary user interfaces that may be implemented in some embodiments.
Figure 9B:
Figure 9C:
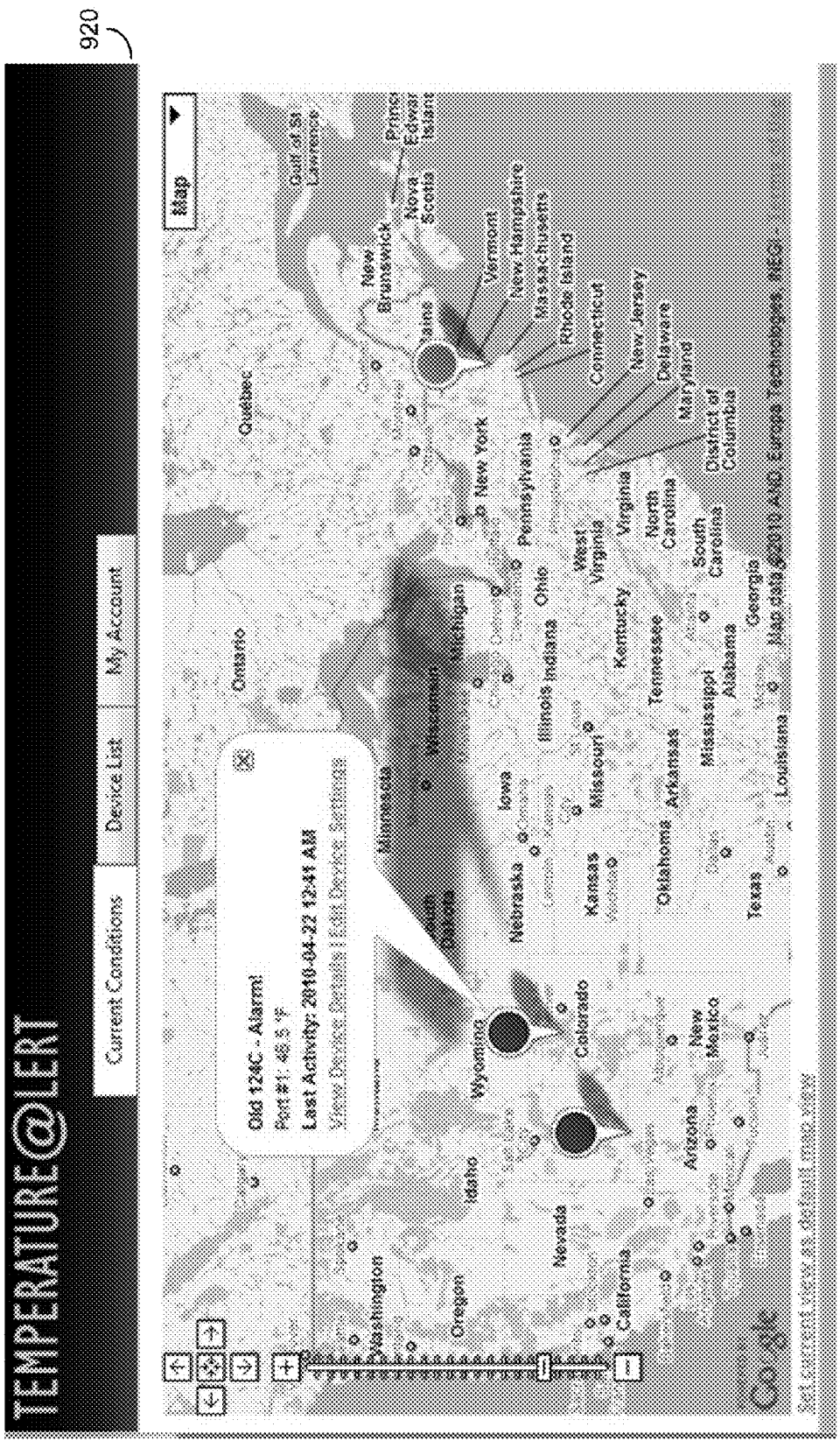

Embodiments are not limited to operating with any particular user interface or visual representation. FIGS. 9A-9C illustrate examples of visual representations and user interfaces that may be used in some embodiments. FIG. 9A includes an interface 900 that includes a visual representation of an environment that is a sketch of a home in which temperature sensors have been placed. As shown in FIG. 9A, the interface 900 includes graphics 902 at positions that correspond to locations in the environment of sensor units. Further, information 904 is displayed in a way that indicates a relationship to a position in the visual representation corresponding to a location of the sensor unit that is a source of the information. In the example of FIG. 9A, the dialog box format by which the information 904 is displayed indicates that the information is related to a sensor unit. Through identifying the relationship, when the user views the information 904 and sees that the information identifies an alarm condition based on the data collected by a sensor unit, the user can quickly identify the sensor unit to which the alarm condition relates; the sensor unit in the bedroom on the second floor.

FIG. 9B shows another illustrative interface 910 that is similar to FIG. 9A in the way the interface displays graphics at positions and displays information, but is different in the style of the visual representation. The visual representation of the interface 910 is a photograph of a server room in which several sensor units have been placed. The information is displayed in the interface 910 in a way that indicates a relationship to a position in the photograph that corresponds to a location of a sensor unit in the environment.

FIG. 9C shows a third illustrative interface 920 that is also similar to FIG. 9A in the way the interface displays graphics at positions and displays information, but shows a third example of a style of visual representation. In the example of FIG. 9C, the visual representation is a map of a large area in which sensor units are disposed. The information is displayed in the interface 920 in a way that indicates a relationship to a position in the photograph that corresponds to a location of a sensor unit in the environment.

Techniques operating according to the principles described herein may be implemented in any suitable manner. Included in the discussion above are a series of flow charts showing the steps and acts of various processes that present information regarding conditions in an environment at positions in a visual representation corresponding to locations of sensor units in the environment. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner, including as computer-readable storage media 1006 of FIG. 10 described below (i.e., as a portion of a computing device 1000) or as a stand-alone, separate storage medium. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Further, some techniques described above comprise acts of storing information (e.g., data and/or instructions) in certain ways for use by these techniques. In some implementations of these techniques—such as implementations where the techniques are implemented as computer-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as computer-executable instructions, these instructions may be executed on one or more suitable computing device(s) operating in any suitable computer system, including the exemplary computer system of FIG. 2, or one or more computing devices (or one or more processors of one or more computing devices) may be programmed to execute the computer-executable instructions. A computing device or processor may be programmed to execute instructions when the instructions are stored in a manner accessible to the computing device/processor, such as in a local memory (e.g., an on-chip cache or instruction register, a computer-readable storage medium accessible via a bus, a computer-readable storage medium accessible via one or more networks and accessible by the device/processor, etc.). Functional facilities that comprise these computer-executable instructions may be integrated with and direct the operation of a single multi-purpose programmable digital computer apparatus, a coordinated system of two or more multi-purpose computer apparatuses sharing processing power and jointly carrying out the techniques described herein, a single computer apparatus or coordinated system of computer apparatuses (co-located or geographically distributed) dedicated to executing the techniques described herein, one or more Field-Programmable Gate Arrays (FPGAs) for carrying out the techniques described herein, or any other suitable system.

Figure 10:
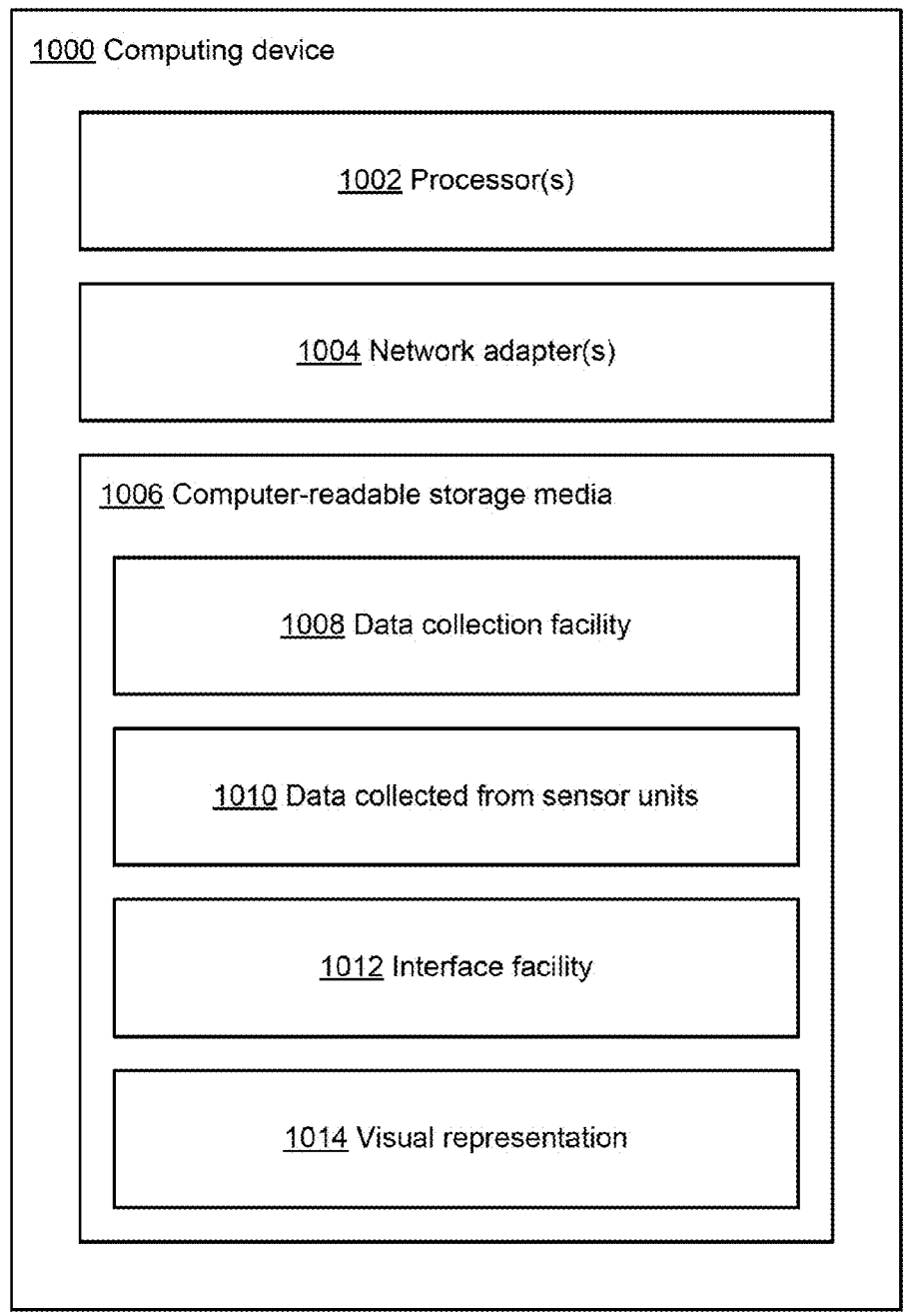
FIG. 10 is a block diagram of an exemplary computing device with which some embodiments may operate.

FIG. 10 illustrates one exemplary implementation of a computing device in the form of a computing device 1000 that may be used in a system implementing the techniques described herein, although others are possible. It should be appreciated that FIG. 10 is intended neither to be a depiction of necessary components for a computing device to operate in accordance with the principles described herein, nor a comprehensive depiction.

Computing device 1000 may comprise at least one processor 1002, a network adapter 1004, and computer-readable storage media 1006. Computing device 1000 may be, for example, a desktop or laptop personal computer, a personal digital assistant (PDA), a smart mobile phone, a server, a wireless access point or other networking element, or any other suitable computing device. Network adapter 1004 may be any suitable hardware and/or software to enable the computing device 1000 to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media 1006 may be adapted to store data to be processed and/or instructions to be executed by processor 1002. Processor 1002 enables processing of data and execution of instructions. The data and instructions may be stored on the computer-readable storage media 1006 and may, for example, enable communication between components of the computing device 1000.

The data and instructions stored on computer-readable storage media 1006 may comprise computer-executable instructions implementing techniques which operate according to the principles described herein. In the example of FIG. 10, computer-readable storage media 1006 stores computer-executable instructions implementing various facilities and storing various information as described above. Computer-readable storage media 1006 may store an information collection facility 1008 that receives information communicated by one or more environmental sensor networks disposed in one or more environments. The information collection facility 1008 may receive the data via the network adapter 1004. The computer-readable storage media 1006 may further store information 1010 that has been received from the sensor networks and an interface facility 1012 for presenting the information to a user. The interface facility 1012 may present the information to the user via any suitable user interface, including via one or more web pages that may be transmitted to the user via the network adapter 1004. As part of presenting information in the user interface, the interface facility 1012 may display a visual representation of an environment to which the information relates. The computer-readable storage media 1006 may therefore also store one or more visual representations 1014 that are received from users.

While not illustrated in FIG. 10, a computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. A method of operating a computing device of an environmental monitoring system that monitors at least one condition of an environment, the environmental monitoring system comprising at least one environmental sensor unit disposed in the environment and the computing device, the environment being managed by an operator, the method comprising:
receiving, at the computing device from the operator, a visual representation of the environment in which the at least one environmental sensor unit is disposed, the visual representation of the environment comprising at least one graphic corresponding to at least one structural and/or topographical element of the environment;
identifying a position, in the visual representation of the environment, that corresponds to a location, in the environment, of a first sensor unit of the at least one environmental sensor unit; and
configuring a user interface that presents information regarding the environment, the configuring comprising configuring the user interface to:
display the visual representation, and
display information related to the first sensor unit so as to indicate a relationship between the information and the position corresponding to the location of the first sensor unit.

2. The method of claim 1, further comprising receiving, at the computing device, information, identifying the location of the first sensor unit, determined by an automated process carried out by the environmental monitoring system.

3. The method of claim 2, wherein receiving, at the computing device, the information identifying the location of the first sensor unit comprises receiving information identifying a geographic location of the first sensor unit.

4. The method of claim 3, wherein receiving the information identifying the geographic location of the first sensor unit comprises receiving, at the computing device, a latitude and longitude for the first sensor unit.

5. The method of claim 2, wherein:
the environmental monitoring system comprises a relay device to relay communications between the first sensor unit and the computing device, and
receiving the information identifying the location of the first sensor unit comprises receiving information identifying a location of the first sensor unit relative to the relay device.

6. The method of claim 2, wherein receiving, at the computing device, the information identifying the location of the first sensor unit comprises receiving the information via at least one wireless wide-area network.

7. The method of claim 2, further comprising:
calculating, at least in part by the first sensor unit, the location of the first sensor unit.

8. The method of claim 1, wherein identifying the position, in the visual representation, that corresponds to the location of the first sensor unit in the environment comprises receiving input from a user indicating the position corresponding to the location of the first sensor unit.

9. The method of claim 8, further comprising:
displaying to the user, via the user interface, the visual representation of the environment, and
wherein identifying the position corresponding to the location comprises:
detecting a user selection of a position in the visual representation; and
storing information indicating that the position selected by the user corresponds to the location in the environment.

10. The method of claim 1, wherein identifying the position in the visual representation comprises:
determining two or more reference locations in the environment represented by two or more reference positions in the visual representation;
based at least in part on the two or more reference locations and on the two or more reference positions, determining a mapping between locations in the environment and positions in the visual representation; and
automatically determining, based on the mapping and on the location of the first sensor unit in the environment, the position in the visual representation that corresponds to the location of the first sensor unit.

11. The method of claim 1, wherein displaying the information related to the first sensor unit so as to indicate the relationship between the information and the position corresponding to the location of the first sensor unit comprises displaying the information related to the first sensor unit at a second position in the user interface proximate to the position corresponding to the location of the first sensor unit.

12. The method of claim 1, further comprising:
receiving information related to data collected by the first sensor unit, wherein the data collected by the first sensor unit includes an ambient temperature of an area adjacent to a component of computer equipment.

13. The method of claim 1, wherein receiving, at the computing device from the operator, the visual representation comprises receiving, at the computing device, the visual representation from one of a plurality of operators from which the computing device is configured to receive input,
wherein the plurality of operators manage a plurality of environments.

14. The method of claim 1, wherein:
receiving from the operator comprises receiving the visual representation and the information identifying the location via at least one first web page stored by the computing device, and
configuring the user interface to display the information regarding the environment comprises configuring the user interface to display the information via at least one second web page stored by the computing device and to display the visual representation in the at least one second web page.

15. The method of claim 1, wherein the visual representation of the environment is a map of the environment.

16. The method of claim 1, wherein the visual representation of the environment further comprises at least one second graphic corresponding to at least one object disposed in the environment.

17. The method of claim 1, wherein the at least one graphic corresponding to the at least one structural and/or topographical element of the environment comprises at least one graphic illustrating a structural and/or topographical element of the environment.

18. The method of claim 1, wherein the at least one graphic corresponding to the at least one structural and/or topographical element of the environment comprises at least one graphic depicting a structural and/or topographical element of the environment.

19. The method of claim 1, wherein:
the location in the environment is a first coordinate in a geographic coordinate system;
the visual representation is an image; and
the position in the visual representation is a second coordinate in a coordinate system for the image.

20. At least one computer-readable storage medium encoded with computer-executable instructions that, when executed by at least one computer, cause the at least one computer to carry out a method of operating a computing device of an environmental monitoring system that monitors at least one condition of an environment, the environmental monitoring system comprising at least one environmental sensor unit disposed in the environment and the computing device, the method comprising:
receiving, at the computing device from an operator of a plurality of operators from which the computing device is configured to receive information, a visual representation of the environment in which the at least one sensor unit is disposed, the visual representation of the environment illustrating at least one structural and/or topographical element of the environment;
identifying, for a location at which a first sensor unit is disposed in the environment, a position in the visual representation of the environment that corresponds to the location in the environment; and
configuring a user interface that presents information regarding the environment, the configuring comprising configuring the user interface to:
display the visual representation, and
display information related to the first sensor unit so as to indicate a relationship between the information and the position corresponding to the location of the first sensor unit.

21. The at least one computer-readable storage medium of claim 20, further comprising receiving, at the computing device, information, identifying the location of the first sensor unit, determined by an automated process carried out by the environmental monitoring system.

22. The at least one computer-readable storage medium of claim 21, wherein:
the environmental monitoring system comprises a relay device to relay communications between the first sensor unit and the computing device, and
receiving the information identifying the location of the first sensor unit comprises receiving information identifying a location of the first sensor unit relative to the relay device.

23. The at least one computer-readable storage medium of claim 20, further comprising receiving, at the computing device, information identifying a geographic location of the first sensor unit.

24. The at least one computer-readable storage medium of claim 20, wherein identifying the position, in the visual representation, that corresponds to the location of the first sensor unit in the environment comprises receiving input from a user indicating the position corresponding to the location of the first sensor unit.

25. The at least one computer-readable storage medium of claim 20, wherein identifying the position in the visual representation comprises:
determining reference locations in the environment represented by reference positions in the visual representation;
based at least in part on the reference locations and the reference positions, determining a mapping between locations in the environment and positions in the visual representation; and
automatically determining, based on the mapping and on the location of the first sensor unit, the position in the visual representation that corresponds to the location of the first sensor unit in the environment.

26. The at least one computer-readable storage medium of claim 20, wherein configuring the user interface to display the information related to the first sensor unit so as to indicate the relationship between the information and the position corresponding to the location of the first sensor unit comprises configuring the user interface to display the information related to the first sensor unit at a position in the user interface proximate to the position corresponding to the location of the first sensor unit.

27. The at least one computer-readable storage medium of claim 20, wherein:
receiving from the operator comprises receiving the visual representation and the information identifying the location via at least one first web page stored by the computing device, and configuring the user interface to display the information regarding the environment comprises configuring the user interface to display the information via at least one second web page stored by the computing device and to display the visual representation in the at least one second web page.

28. An environmental monitoring system that monitors at least one condition of an environment, the environment being managed by an operator, the environmental monitoring system comprising:
　at least one environmental sensor unit disposed in the environment; and
　a computing device, the computing device comprising:
　　at least one processor; and
　　at least one computer-readable storage medium having encoded thereon processor-executable instructions that, when executed by the at least one processor, cause the at least one processor to carry out a method comprising:
　　　receiving, at the computing device from the operator, a visual representation of the environment in which the at least one sensor unit is disposed, the visual representation being a graphical diagram of the environment;
　　　identifying a position in the visual representation of the environment that corresponds to a location in the environment of a first sensor unit of the at least one environmental sensor unit; and
　　　configuring a user interface that presents information regarding the environment, the configuring comprising configuring the user interface to:
　　　　display the visual representation, and
　　　　display information related to the first sensor unit so as to indicate a relationship between the information and the position corresponding to the location of the first sensor unit.

29. The environmental monitoring system of claim 28, wherein the method further comprises receiving, at the computing device, information, identifying the location of the first sensor unit, determined by an automated process carried out by the environmental monitoring system.

30. The environmental monitoring system of claim 29, wherein receiving, at the computing device, the information identifying the location of the first sensor unit comprises receiving information identifying a geographic location of the first sensor unit.

31. The environmental monitoring system of claim 29, wherein:
　the environmental monitoring system further comprises a relay device to relay communications between the first sensor unit and the computing device, and
　receiving the information identifying the location of the first sensor unit comprises receiving information identifying a location of the first sensor unit relative to the relay device.

32. The environmental monitoring system of claim 28, wherein identifying the position, in the visual representation, that corresponds to the location of the first sensor unit in the environment comprises receiving input from a user indicating the position corresponding to the location of the first sensor unit.

33. The environmental monitoring system of claim 28, wherein identifying the position in the visual representation comprises:
　determining reference locations in the environment represented by reference positions in the visual representation;
　based at least in part on the reference locations and the reference positions, determining a correspondence between locations in the environment and positions in the visual representation; and
　automatically determining, based on the correspondence, the position in the visual representation corresponding to the location of the first sensor unit in the environment.

34. The environmental monitoring system of claim 28, wherein the at least one environmental sensor unit comprises a sensor unit to detect an ambient temperature and is located in the environment adjacent to a component of computer equipment to detect the ambient temperature adjacent to the component, and
　the method further comprises receiving information related to data collected by the sensor unit regarding the ambient temperature adjacent to the component of computer equipment.

35. The environmental monitoring system of claim 28, wherein:
　receiving from the operator comprises receiving the visual representation and the information identifying the location via at least one first web page stored by the computing device, and
　configuring the user interface to display the information regarding the environment comprises configuring the user interface to display the information via at least one second web page stored by the computing device and to display the visual representation in the at least one second web page.

36. The environmental monitoring system of claim 28, wherein the graphical diagram of the environment is a map of the environment.

37. The environmental monitoring system of claim 28, wherein the graphical diagram of the environment comprises one or more graphics illustrating one or more objects disposed in the environment.

38. The environmental monitoring system of claim 28, wherein the graphical diagram of the environment comprises one or more graphics illustrating one or more structural elements of the environment.

39. The environmental monitoring system of claim 28, wherein the graphical diagram of the environment comprises one or more graphics illustrating one or more topographical features of the environment.

* * * * *